US009817051B2

(12) United States Patent
Kawakami et al.

(10) Patent No.: US 9,817,051 B2
(45) Date of Patent: Nov. 14, 2017

(54) ALTERNATING CURRENT LOSS MEASURING APPARATUS

(71) Applicant: Hitachi, Ltd., Tokyo (JP)

(72) Inventors: Tatsuhiko Kawakami, Tokyo (JP); Takeshi Kawamura, Tokyo (JP); Manabu Aoki, Tokyo (JP); Yukinobu Imamura, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 19 days.

(21) Appl. No.: 15/140,776

(22) Filed: Apr. 28, 2016

(65) Prior Publication Data

US 2016/0341778 A1    Nov. 24, 2016

(30) Foreign Application Priority Data

May 19, 2015 (JP) ................. 2015-101492

(51) Int. Cl.
G01R 1/44 (2006.01)
G01R 31/02 (2006.01)
H01L 39/00 (2006.01)

(52) U.S. Cl.
CPC .............. *G01R 31/02* (2013.01); *H01L 39/00* (2013.01)

(58) Field of Classification Search
CPC ........ G01R 1/44; G01R 11/185; G01R 19/32; G01R 21/14; G01R 11/32; G01R 11/34; G01R 11/56; G01R 11/64; G01R 19/04; G01R 19/2506; G01R 21/008; G01R 21/1338
See application file for complete search history.

(56) References Cited

U.S. PATENT DOCUMENTS 9,689,367 B2 * 6/2017 Schramme ............ F02N 11/108
2005/0083033 A1 * 4/2005 Kurosawa ............ G01R 15/246
324/96

FOREIGN PATENT DOCUMENTS

DE        4320658 C1    6/1993
JP        07-027725 A   1/1995

* cited by examiner

*Primary Examiner* — Tung X Nguyen
(74) *Attorney, Agent, or Firm* — Mattingly & Malur, PC

(57) ABSTRACT

An alternating current loss measuring apparatus for superconductors includes a superconductor specimen, a magnetic field applying coil, a radiation shield, a vacuum vessel, first cooling means, and second cooling means. The first cooling means or the second cooling means is provided with a temperature regulating mechanism. The magnetic field applying means and the radiation shield are set to be a first cooling part, whereas the superconductor specimen is set to be a second cooling part, and the first cooling part and the second cooling part are cooled by first and second cooling means, respectively. A high thermal resistance member is disposed between the superconductor specimen and the second cooling means, and temperature measuring means are disposed at at least two positions on the high thermal resistance member. The alternating current loss of a superconductor under an external magnetic field can be measured at each of different temperatures.

6 Claims, 4 Drawing Sheets

F I G. 3
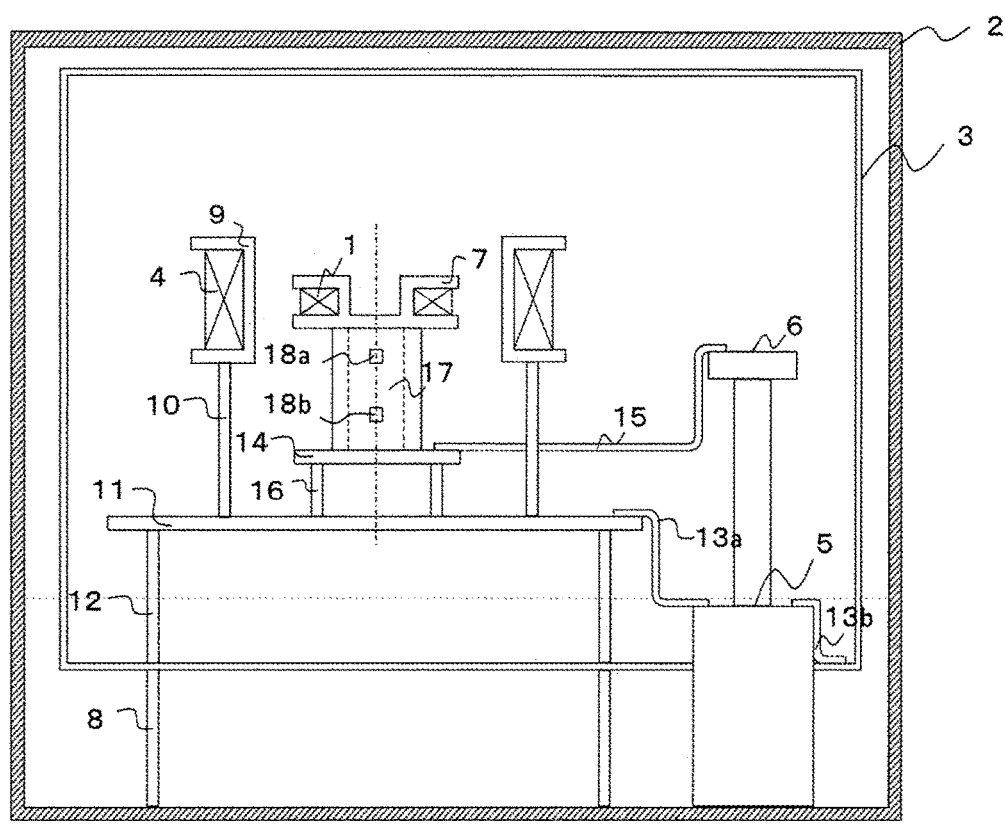

F I G. 4
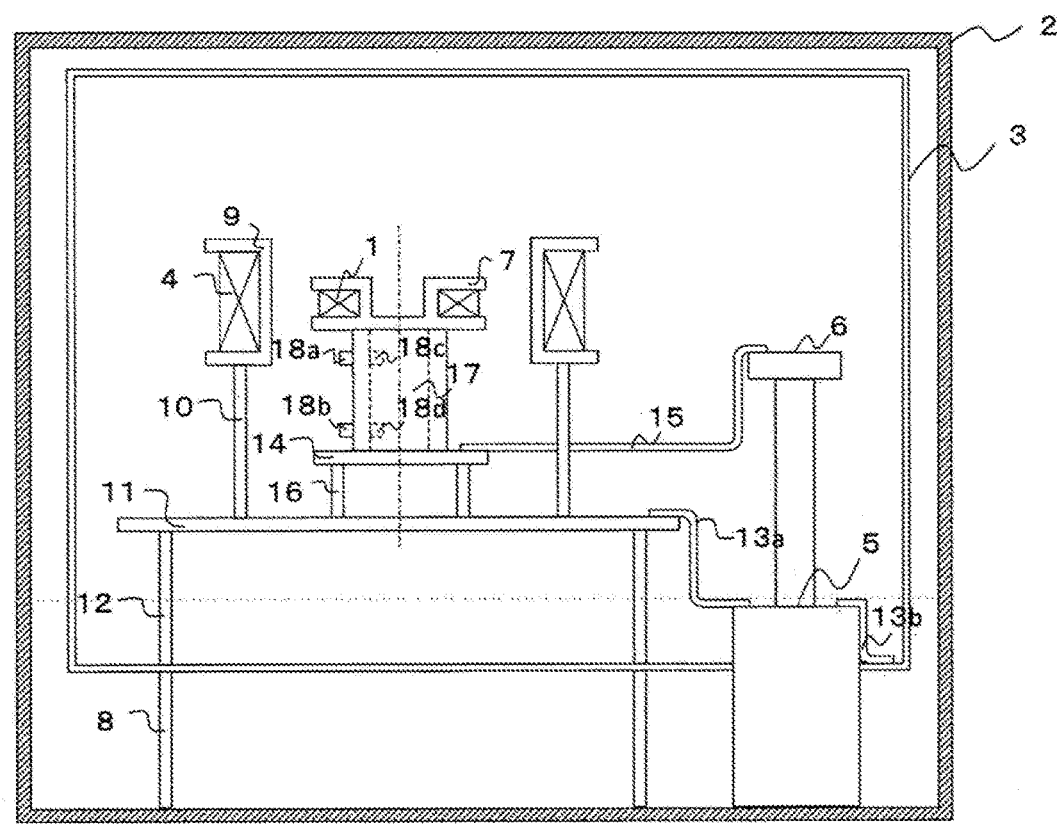

ALTERNATING CURRENT LOSS MEASURING APPARATUS

BACKGROUND OF THE INVENTION

1. Field of the Invention

The present invention relates to an apparatus for measuring alternating current (AC) loss of a superconductor.

2. Description of the Related Art

Methods for measuring AC loss of superconductors include a temperature measurement method in which a temperature rise in a superconductor upon application of an AC magnetic field is measured, and an evaporation method in which the quantity of evaporation of a refrigerant upon application of an AC magnetic field is measured. The temperature measurement method has an advantage over the evaporation method in that measurement accuracy is higher and the time constant of temperature variation at the time when a heating output is applied or cut off is shorter (see, for example, JP-7-27725-A). In the example described in the patent document, the specimen is surrounded by a medium, having low thermal conductivity, which serves as a thermal resistance with respect to the surrounding liquid helium bath.

SUMMARY OF THE INVENTION

In the method of JP-7-27725-A, however, since the specimen is cooled by liquid helium, the temperature of the specimen is fixed at 4K. Therefore, it is impossible by the method to measure AC loss at arbitrary temperatures other than 4K, for superconducting apparatuses in which superconductors are used.

In order to solve the above-mentioned problem, according to an aspect of the present invention, there is provided an AC loss measuring apparatus including: a holder on which to dispose a specimen; a magnetic field applying coil that applies a magnetic field to the specimen disposed on the holder; a second cooling member that supports the holder; a first cooling member cooled to a temperature higher than a temperature of the second cooling member; a columnar member disposed to contact both the holder and the second cooling member; a radiation shield formed to confine the holder, the magnetic field applying coil, the first cooling member, the second cooling member and the columnar member in a single space; a vacuum vessel in which to confine the radiation shield; second cooling means attached to the second cooling member; first cooling means attached to the first cooling member and the radiation shield; first temperature measuring means provided on a surface of the columnar member and at a position nearer to the holder than to the second cooling member, the position being on an axis connecting the holder and the second cooling member; second temperature measuring means provided on the surface of the columnar member and at a position nearer to the second cooling member than to the holder, the position being on the axis connecting the holder and the second cooling member; and a measuring device connected to the first temperature measuring means and the second temperature measuring means.

According to the described aspect of the present invention, AC loss can be measured at arbitrary temperatures other than 4K, for superconducting apparatuses in which superconductors are used.

BRIEF DESCRIPTION OF THE DRAWINGS

FIG. 3 is an overall schematic view of an AC loss measuring apparatus for superconductors according to Embodiment 3 of the present invention; and FIG. 4 is an overall schematic view of an AC loss measuring apparatus for superconductors according to Embodiment 4 of the present invention.

DESCRIPTION OF THE PREFERRED EMBODIMENTS

Figure 1:
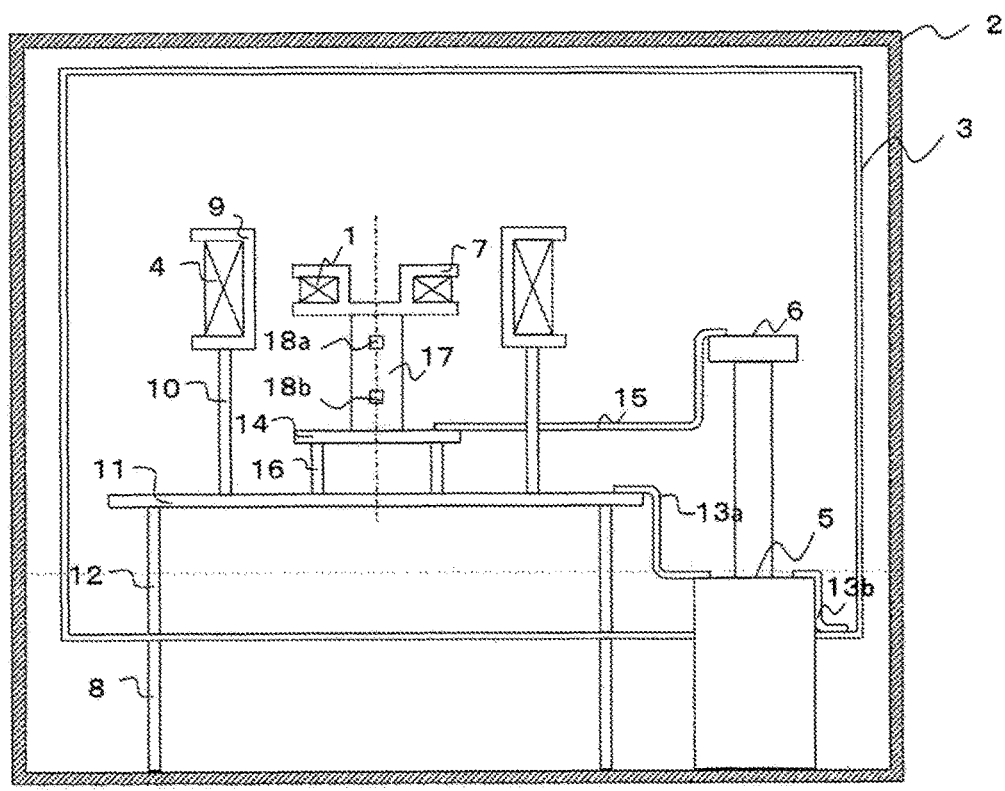
FIG. 1 is an overall schematic view of an AC loss measuring apparatus for superconductors according to Embodiment 1 of the present invention.

The present invention will be described below, referring to the drawings.

Embodiment 1

Superconductors are used as high magnetic field generating means in a variety of fields. For example, for a superconducting coil in practical use in a magnetic resonance imaging (MRI) apparatus or the like, a material capable of maintaining a superconducting state at a cryogenic temperature of 4K, which is the evaporation temperature of liquid helium, is selected. Typical examples of such a material include metallic superconductors such as NbTi and $Nb_3Sn$, and superconducting wires made by use of such a material are mainly used. On the other hand, $MgB_2$ and oxide superconductors having critical temperatures higher than the critical temperatures of these metallic superconductors (the superconductors having the higher critical temperatures will hereinafter be referred to as high temperature superconductors) are used in some cases. Superconducting coils made by use of high temperature superconductors can maintain a superconducting state even at temperatures higher than 4K. Therefore, the high temperature superconductors can maintain a superconducting state by a conduction cooling system, without using liquid helium.

The conduction cooling system is advantageous over an immersion cooling system using liquid helium in that the amount of helium, which is a scarce resource, to be used in the conduction cooling system is extremely small, which ensures a lower operating cost. In addition, in the conduction cooling system using a refrigerator, by regulating the output of the refrigerator it is possible to regulate the operating temperature of the superconducting coil and, hence, to design the operating temperature in an arbitrary manner.

Here, in applying a superconductor, particularly, a high temperature superconductor to an AC apparatus, it is important to evaluate the heating or heat generation (AC loss) that occurs when an AC current or magnetic field acts on the superconductor. For instance, in a superconducting coil for use in an MRI apparatus, a gradient magnetic field in a pulse form of, for example, several tens to several thousands of hertz acts on the superconducting coil at the time of imaging. The pulsed gradient magnetic field causes an AC loss, which raises the temperature of the superconductor. When the temperature of the superconductor exceeds the critical temperature, there occurs quench, namely, transition of the whole body of the coil into a normal conducting state with the result of disappearance of the magnetic field. If the quench occurs, it becomes impossible to use the MRI apparatus until the magnetic excitation is redone after cooling the superconducting coil to or below the critical temperature.

In order to suppress the possibility of occurrence of such a quench, it is important to design the system such as not to generate quench, by designing the total amount of heating inclusive of the AC loss to be less than the refrigerating capacity of the refrigerator. Note that the AC loss of a superconductor is known to depends on temperature; if a high temperature superconductor is to be used for an MRI apparatus, therefore, it is necessary to evaluate the AC loss while assuming the operating temperature to be in the range of, for example, 15 to 30K.

FIG. 1 shows an overall schematic view of an AC loss measuring apparatus for superconductors according to Embodiment 1 of the present invention. Note that the AC loss measuring apparatus according to the present invention may be applied to measurement of AC loss of a material other than superconductor.

The present apparatus includes: a specimen 1 which is a superconductor; a vacuum vessel 2 which accommodates the specimen 1 and confines a radiation shield 3 therein; the radiation shield 3 which shields radiant heat from the vacuum vessel 2 to the specimen 1; a magnetic field applying coil 4 for applying an AC magnetic field to the specimen 1; first cooling means 5 and second cooling means 6; a high thermal resistance member 17 which is a columnar member disposed to contact both a base 14 for the specimen 14 and a coil bobbin 7; and temperature measuring means 18 disposed at at least two positions on the high thermal resistance member 17. Note that the temperature measuring means 18 are connected to a measuring device (not shown), and various calculations are carried out using output signals.

The magnetic field applying coil 4 and the radiation shield 3 are cooled by a base 11 which is a first cooling member, and the specimen 1 is cooled by the base 14 which is a second cooling member. The first and second cooling members are cooled respectively by the first cooling means 5 and the second cooling means 6. For instance, the first cooling means 5 and the second cooling means 6 are a first cooling stage and a second cooling stage of a two-stage Gifford-McMahon (GM) refrigerator. The first cooling means 5 and the second cooling means 6 are provided with heaters (temperature regulators) made by use of a high electric resistance material, for example, manganin wire or nichrome wire, so that the temperatures of the first cooling means 5 and the second cooling means 6 can be regulated arbitrarily by varying the outputs of the heaters. Note that in the case where an environment for measurement is fixed, the first cooling means 5 and the second cooling means 6 may be designed in such a manner that the first cooling member and the second cooling member are set to predetermined temperatures, without providing such temperature regulators.

The specimen 1 is, for example, a superconducting coil obtained by a method wherein a superconducting wire made by use of a metallic superconductor such as NbTi, $Nb_3Sn$, etc. or a high temperature superconductor such as $MgB_2$, oxide superconductor, etc. is wound around the coil bobbin 7. Thus, the holder on which to place the specimen 1 is the coil bobbin 7 in this embodiment. In order to avoid generation of an eddy current loss at the time of applying an AC magnetic field, it is desirable that a material having a high electric resistivity such as fiberglass reinforced plastic (FRP) is used for the coil bobbin 7. Note that the shape of the coil bobbin 7 is not limited to a circular shape; for example, the shape may be a race track-like shape or a saddle-like shape. In addition, the specimen 1 may be a superconducting cable or a bulk superconductor. Besides, the shape of the holder is not limited to the bobbin shape but may be determined according to the shape of the specimen 1. For instance, in the case of measuring a specimen in a lump form such as a superconducting bulk, a dish-shaped holder may be used.

In addition, as shown in FIG. 1, the specimen 1 is cooled by the second cooling means 6 through the base 14, which is the second cooling part, the high thermal resistance member 17C, which is a columnar member, and further the coil bobbin 7.

The inside of the vacuum vessel 2 is maintained in a vacuum state for establishing an adiabatic condition. The radiation shield 3 should be made by selecting a low-emissivity material (e.g., aluminum), and is supported on the vacuum vessel 2 through a load support 8. Besides, the radiation shield 3 is formed such as to confine the coil bobbin 7, the magnetic field applying coil 4, the base 11, the base 14 and the high thermal resistance member 17 in a single space.

In order to reduce the quantity of heat transmitted from the vacuum vessel 2, the load support 8 is configured by use of a material which is low in thermal conductivity at low temperatures, such as FRP. The radiation shield 3 is connected to the first cooling means 5 by a flexible conductor 13b made by processing copper, which is high in thermal conductivity at low temperatures. A heat transfer plate made of copper may be used in place of the flexible conductor 13b.

The magnetic field applying coil 4 is configured by winding copper wire around a coil bobbin 9. For preventing collapse of coil and for enhancing thermal conductivity between loops of winding, the winding is desirably adhered by immersion with resin or by using an adhesive which is high in thermal conductivity at low temperatures. In order that the magnetic field is not canceled by an eddy current generated when an AC magnetic field is applied, the coil bobbin 9 is desirably produced by use of FRP or Bakelite which has a high electric resistivity.

The magnetic field applying coil 4 is supported on the base 11 through the load support 10. The base 11 is supported on the vacuum vessel 2 through load supports 8 and 12. The base 11 is connected to the first cooling means 5 by a flexible conductor 13a produced by processing copper, which is high in thermal conductivity at low temperatures. The wire of the magnetic field applying coil 4 is wired to an AC power source located outside the vacuum vessel 2 through current lead wires. For restraining radiation of heat from the coil bobbin 9 to the specimen 1, the magnetic field applying coil 4 and the coil bobbin 9 are preferably cooled, and the load support 10 is desirably made by use of copper or aluminum, which is high in thermal conductivity at low temperatures. By restraining radiation of heat from the coil bobbin 9 to the specimen 1, it is possible to reduce noises at the time of measuring AC loss, and to enhance the measurement accuracy.

Further, in order to remove the heat generated due to Joule heating upon passing a current at the time of measurement, it is desirable to attach a copper heat transfer plate to a winding part of the magnetic field applying coil 4 and to connect the heat transfer plate and the first cooling means 5 through a flexible conductor or the like. Note that since the temperature of the first cooling means 5 in the case where the GM refrigerator is used is about 30 to 80K, which is lower than the critical temperature of a copper oxide superconductor, the magnetic field applying coil 4 may be one made of a superconductor. This configuration makes it possible to pass a larger current than in the case of a copper wire, and therefore has an advantage in that AC loss due to an AC magnetic field of a larger amplitude can be measured.

In the case where a magnetic field applying coil 4 larger in diameter than the specimen 1 is disposed coaxially with the specimen 1, as in this embodiment, it is preferable that the magnetic field applying coil 4 has a solenoid shape with a larger length in the axial direction as compared to the specimen 1. This ensures that the spatial distribution of the magnetic field applied from the magnetic field applying coil 4 to the specimen 1 approaches a uniform distribution, and, accordingly, accurate measurement can be achieved.

Note that the shape and layout of the magnetic field applying coil 4 are not restricted, and there can be adopted, for example, a configuration in which the coil is smaller than the specimen 1 and a magnetic field is locally applied to part of the specimen 1.

This embodiment is characterized in that the high thermal resistance member 17 is disposed between the specimen 1 and the second cooling means 6, and the temperature measuring means 18 are disposed at at least two positions on the high thermal resistance member 17. To be more specific, as depicted in FIG. 1, first temperature measuring means 18a is provided on a surface of the high thermal resistance member 17 and at a position nearer to the coil bobbin 7 than to the base, the position being on an axis connecting the coil bobbin 7 and the base 14; on the other hand, second temperature measuring means 18b is provided on the surface of the high thermal resistance member 17 and at a position nearer to the base 14 than to the coil bobbin 7, the position being on the axis connecting the coil bobbin 7 and the base 14. Note that the terms "first" and "second" here are used merely for convenience of explanation, and it is sufficient that the temperature measuring means are provided at different distances from the cooling means.

The principle of measurement by the AC loss measuring apparatus according to this embodiment and a preferable configuration of the high thermal resistance member 17 will be described below.

The specimen 1 is connected through the high thermal resistance member 17 to the cooling plate 14 made by use of copper, which is high in thermal conductivity at low temperatures. The cooling plate 14 is connected to the second cooling means 6 through a flexible conductor 15 made by use of copper, which is high in thermal conductivity at low temperatures. The cooling plate 14 is supported on the base 11 through a load support 16. In order to reduce the quantity of heat transferred from the base 11, the load support 16 is preferably made by adopting a material low in thermal conductivity at low temperatures, such as FRP.

In the measurement conducted using the present apparatus, an AC magnetic field is applied from the magnetic field applying coil 4, and temperature measurement is carried out using the at least two temperature measuring means 18 disposed on the high thermal resistance member 17. The temperature measuring means 18 include the first temperature measuring means 18a disposed on the surface of the high thermal resistance member 17 at a position near the specimen 1 (on the higher temperature side) and the second temperature measuring means 18b disposed on the surface of the high thermal resistance member 17 at a position near the second cooling means (on the lower temperature side). The AC loss generated in the specimen 1 due to an AC magnetic field is transmitted to the second cooling means 6 through the coil bobbin 1, the high thermal resistance member 17 and the cooling plate 14. In the case where the distribution of a heat flux passing through the high thermal resistance member 17 is uniform in a section orthogonal to the axial direction, the heat flux Q passing through the high thermal resistance member 17 is represented by the following formula (1) according to Fourier's Law, where A [m²] is the sectional area of the high thermal resistance member 17, λ [W/m·K] is thermal conductivity, L [m] is the distance between the higher temperature side temperature measuring means 18a and the lower temperature side temperature measuring means 18b, $T_H$ [K] is the temperature of the higher temperature side temperature measuring means 18a, and $T_L$ [K] is the temperature of the lower temperature side temperature measuring means 18b.

$$Q = \frac{A}{L}\int_{T_L}^{T_H} \lambda\, dT \qquad (1)$$

In general, λ varies with temperature, but in the case where the difference between $T_H$ and $T_L$ is small, λ can be approximated as constant, and the formula (1) is transformed into the following formula (2).

$$Q = \frac{A}{L}\lambda \Delta T \qquad (2)$$

Here, ΔT is the temperature difference between the higher temperature side temperature measuring means 18a and the lower temperature side temperature measuring means 18b, and is defined by the following formula (3).

$$\Delta T = T_H - T_L \qquad (3)$$

The AC loss of the specimen 1 is evaluated by use of the formula (1) or formula (2). In the case where the radiation loss from the coil bobbin 9 or the radiation shield 3 higher than specimen 1 in temperature to the specimen 1 or the transfer loss through the measuring wire extending from the temperature measuring means 18 is not negligibly small in relation to the AC loss of the specimen 1, such a non-negligible loss is subtracted from Q, whereby the AC loss of the specimen 1 can be obtained. Since the formula (1) and formula (2) are based on an assumption that the distribution of heat flux is uniform in the section orthogonal to the flow direction of the heat flux, it is a proposition that the temperature distribution in the section is uniform.

The high thermal resistance member 17 is desirably cylindrical in structure. This leads to an advantage that the temperature distribution in the circling direction in the section is uniform. The high thermal resistance member 17 is desirably made by utilizing a material which is high in electric resistivity and low in thermal conductivity, such as FRP. This results in that generation of an eddy current in the high thermal resistance member 17 can be avoided, and, since ΔT becomes large, the resolution of measurement of AC loss becomes smaller. Note that FRP is merely an example, and any other material that is suited to the measurement conditions may be adopted.

An end portion on one side of the high thermal resistance member 17 is connected to the coil bobbin 7 of the specimen 1. The high thermal resistance member 17 and the coil bobbin 7 are connected by an adhesive or by a fastening member such as a bolt. It is desirable that the contact thermal resistance between the high thermal resistance member 17 and the coil bobbin 7 be small. In the case of fastening, a bonding agent low in contact thermal resistance is desirably sandwiched between the high thermal resistance member 17 and the coil bobbin 7. Alternatively, a soft thin film of indium or the like may be sandwiched between the high thermal resistance member 17 and the coil bobbin 7. This permits the contact thermal resistance to become negligibly small. For avoiding generation of an eddy current, the fastening member is desirably made by use of FRP which has a high electric resistivity. Note that the high thermal resistance member 17 and the coil bobbin 7 may be integral in configuration. This leads to an advantage that a temperature difference due to contact thermal resistance is not generated between the high thermal resistance member 17 and the coil bobbin 7. Besides, a material which is high in thermal conductivity at low temperatures, such as aluminum, may be inserted between the high thermal resistance member 17 and the coil bobbin 7. This can prevent unevenness of temperature distribution from being generated in the section orthogonal to the flow direction of the heat flux, resulting in an advantage that highly accurate measurement can be achieved. The above-mentioned indium is high in thermal conductivity at low temperatures, and, therefore, the use of indium is effective also from the viewpoint of making the temperature distribution uniform.

An end portion on the other side of the high thermal resistance member 17 is connected to the cooling plate 14. The high thermal resistance member 17 and the cooling plate 14 are connected by an adhesive or by a fastening member such as a bolt. It is desirable to fasten the high thermal resistance member 17 and the cooling plate 14 by a bolt or the like, with the aforementioned adhesive or bonding agent sandwiched therebetween.

The temperature measuring means 18 disposed on the high thermal resistance member 17 are, for example, Cernox thermometers. In order that the contact thermal resistance between the high thermal resistance member 17 and the temperature measuring means 18 is negligibly small, it is desirable to apply a bonding agent as aforementioned to the surfaces of the temperature measuring means 18. In addition, those parts of the high thermal resistance member 17 at which the temperature measuring means 18 are disposed are desirably processed to be planar. This increases the contact area between the high thermal resistance member 17 and the temperature measuring means 18, whereby contact thermal resistance is reduced advantageously. Furthermore, to the temperature measuring means 18, a fixed contact pressure may be applied by a presser plate which is fastened to the high thermal resistance member 17 by a bolt equipped with a spring washer. This brings the high thermal resistance member 17 and the temperature measuring means 18 into close contact with each other, whereby contact thermal resistance is reduced advantageously.

Measuring wires extending from the temperature measuring means 18 are introduced from outside the vacuum vessel 2, and fixed points of temperature are taken at two parts, namely, the base 1 and the cooling plate 14, for reducing the amount of heat penetration. Since the high thermal resistance member 17 is higher than the cooling plate 14 in temperature, it is necessary, for reducing the heat transfer loss from the measuring wires, to set the thermal resistance of the measuring wires to be sufficiently high. For this reason, it is desirable that the measuring wires be composed of manganin wire or the like which is high in thermal conductivity at low temperatures, and be small in wire diameter and large in length. In addition, in order to reduce noises generated at the time of measurement, it is desirable to intertwist the measuring wires such as to reduce the voltage induced by an AC magnetic field.

Besides, the AC loss measuring apparatus in this embodiment is capable of measuring an AC loss arising from a gradient magnetic field, for a superconducting magnet in the MRI apparatus as aforementioned, under arbitrary temperature conditions. Specifically, by a method in which a pulsed magnetic field generated from a gradient magnetic field coil is simulated by the magnetic field applying coil 4, an AC loss generated in a superconductor under MRI apparatus environments can be measured. Particularly, the gradient magnetic field is a high frequency magnetic field generated in a pulse form; if it is attempted to measure the gradient magnetic field under liquid helium environments as in the prior art, therefore, shielding of the magnetic field may occur to make the measurement difficult in the case where the liquid helium vessel is a highly conductive member. In addition, under liquid helium environments the measuring temperature is fixed at 4K and, therefore, it is difficult to perform the measurement in arbitrary temperature environments.

In the AC loss measuring apparatus according to this embodiment, on the other hand, not any member that shields an AC magnetic field by generating an eddy current is present between the magnetic field applying coil 4 and the specimen 1. In addition, it is possible to set an arbitrary temperature environment and measure AC loss, by regulating the temperature of the first cooling means 5 or the second cooling means 6 or the temperatures of both of the cooling means.

Embodiment 2

Figure 2:
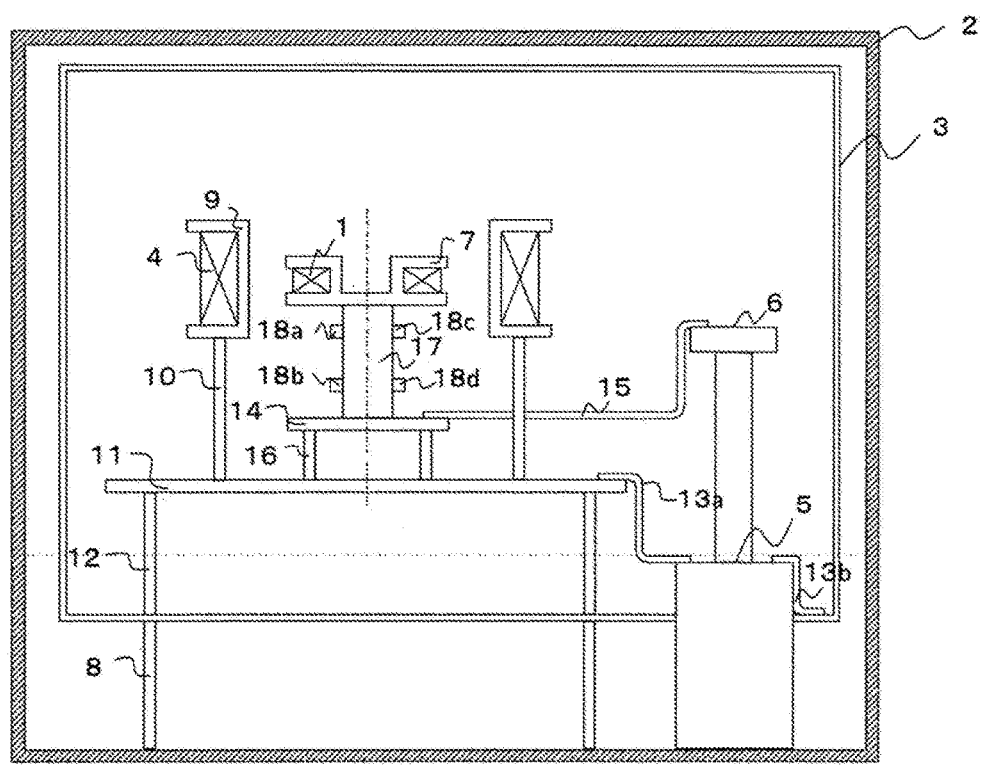
FIG. 2 is an overall schematic view of an AC loss measuring apparatus for superconductors according to Embodiment 2 of the present invention.

FIG. 2 shows an overall schematic view of an AC loss measuring apparatus for superconductors according to Embodiment 2 of the present invention. The measuring apparatus of Embodiment 2 differs from the measuring apparatus of Embodiment 1 in that the temperature measuring means 18 are disposed on a surface of the high thermal resistance member 17 and at at least two parts on a plane orthogonal to an axial direction (specifically, a straight line connecting the base 14 and the coil bobbin 7). In FIG. 2, temperature measuring means 18c and 18d are disposed at positions shifted by 180 degrees from the positions of the first temperature measuring means 18a (on the higher temperature side) and second temperature measuring means 18b (on the lower temperature side) of the temperature measuring means 18. In the base where the distribution of a heat flux passing through the high thermal resistance member 17 is uniform in a section orthogonal to the axial direction, the temperatures of the temperature measuring means 18a and 18c are in the same range, and the temperatures of the temperature measuring means 18b and 18d are in the same range. By averaging temperature values in the same range, therefore, the uncertainty of measured values is reduced. In addition, if a local AC loss is generated in the specimen 1, a situation may be considered in which the temperature is not uniform in a section orthogonal to the axial direction of the high thermal resistance member 17. Even in such a situation, by adopting the configuration according to this embodiment, the temperature distribution in the section orthogonal to the axial direction can be measured, and, therefore, local AC loss can also be measured accurately.

Embodiment 3

FIG. 3 shows an overall schematic view of an AC loss measuring apparatus for superconductors according to Embodiment 3 of the present invention. The measuring apparatus of Embodiment 3 differs from the measuring apparatus of Embodiment 1 in that the high thermal resistance member 17 has a hollow cylindrical shape with a small wall thickness. This configuration ensures that a temperature difference is less liable to be generated between an outside surface and an inside surface in a section orthogonal to the axial direction of the high thermal resistance member 17, and that the distribution of heat flux is liable to be uniform in the section. Accordingly, there is an advantage that the heat flux can be measured accurately.

Embodiment 4

FIG. 4 shows an overall schematic view of an AC loss measuring apparatus for superconductors according to Embodiment 4 of the present invention. The measuring apparatus of Embodiment 4 differs from the measuring apparatus of Embodiment 3 in that the temperature measuring means 18 are disposed on an outer circumference side and an inner circumference side of the high thermal resistance member 17 which has a hollow shape with a small wall thickness. In FIG. 4, temperature measuring means 18c and 18d are disposed at positions opposite, by way of the high thermal resistance member 17, to the higher temperature side temperature measuring means 18a and the lower temperature side temperature measuring means 18b of the temperature measuring means 18 which are disposed on the outer circumference side of the high thermal resistance member 17. In the case where the distribution of heat flux passing through the high thermal resistance member 17 is uniform in a section orthogonal to the axial direction, the temperatures of the temperature measuring means 18a and 18c are in the same range, and the temperatures of the temperature measuring means 18b and 18d are in the same range. By averaging temperature values in the same range, therefore, the uncertainty of measured values is reduced, and measurement accuracy is enhanced. In addition, in the case where local AC loss is generated in the specimen 1, temperature distribution can be measured in the same manner as in Embodiment 2. Besides, like in Embodiment 3, a temperature difference is less liable to be generated between an outside surface and an inside surface of the high thermal resistance member 17, so that accurate measurement can be achieved.

What is claimed is:

1. An alternating current loss measuring apparatus comprising:
  a holder on which to dispose a specimen;
  a magnetic field applying coil that applies a magnetic field to the specimen disposed on the holder;
  a second cooling member that supports the holder;
  a first cooling member cooled to a temperature higher than a temperature of the second cooling member;
  a columnar member disposed to contact both the holder and the second cooling member;
  a radiation shield formed to confine the holder, the magnetic field applying coil, the first cooling member, the second cooling member and the columnar member in a single space;
  a vacuum vessel in which to confine the radiation shield;
  second cooling means attached to the second cooling member;
  first cooling means attached to the first cooling member and the radiation shield;
  first temperature measuring means provided on a surface of the columnar member and at a position nearer to the holder than to the second cooling member, the position being on an axis connecting the holder and the second cooling member;
  second temperature measuring means provided on the surface of the columnar member and at a position nearer to the second cooling member than to the holder, the position being on the axis connecting the holder and the second cooling member; and
  a measuring device connected to the first temperature measuring means and the second temperature measuring means.

2. The alternating current loss measuring apparatus according to claim 1, further comprising
  a temperature regulator attached to the second cooling means or the first cooling means.

3. The alternating current loss measuring apparatus according to claim 1,
  wherein the second cooling means is a second cooling stage of a Gifford-McMahon refrigerator,
  the first cooling means is a first cooling stage of a Gifford-McMahon refrigerator, and
  the first cooling stage and the second cooling stage are possessed by a single Gifford-McMahon refrigerator.

4. The alternating current loss measuring apparatus according to claim 1,
  wherein a plurality of the first temperature measuring means and a plurality of the second temperature measuring means are provided at different positions on a plane orthogonal to the axis connecting the holder and the second cooling member.

5. The alternating current loss measuring apparatus according to claim 1,
  wherein the columnar member is a hollow cylindrical member having a small wall thickness.

6. The alternating current loss measuring apparatus according to claim 5,
  wherein the first temperature measuring means or the second temperature measuring means is provided on each of an outside surface and an inside surface of the columnar member that is hollow, cylindrical and small in wall thickness.

* * * * *